United States Patent
Taddeo (10) Patent No.: US 7,272,062 B2
(45) Date of Patent: Sep. 18, 2007

(54) CURRENT SENSE AMPLIFIER FOR LOW VOLTAGE APPLICATIONS WITH DIRECT SENSING ON THE BITLINE OF A MEMORY MATRIX

(75) Inventor: Alberto Taddeo, Arenzano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 36 days.

(21) Appl. No.: 11/261,901

(22) Filed: Oct. 28, 2005

(65) Prior Publication Data
US 2006/0158946 A1 Jul. 20, 2006

(30) Foreign Application Priority Data
Oct. 29, 2004 (IT) .......................... MI2004A2074

(51) Int. Cl.
*G11C 7/02* (2006.01)
(52) U.S. Cl. ...................................... 365/207; 365/203
(58) Field of Classification Search ............... 365/207, 365/203, 205, 185.2
See application file for complete search history.

(56) References Cited

U.S. PATENT DOCUMENTS

| 6,292,397 | B1 * | 9/2001 | Kim ......................... 365/185.2 |
| 6,791,879 | B1 * | 9/2004 | Adkins ................... 365/185.21 |
| 7,020,036 | B2 * | 3/2006 | Shen et al. ................. 365/210 |
| 7,164,604 | B2 * | 1/2007 | Arakawa ............... 365/185.21 |

* cited by examiner

*Primary Examiner*—Anh Phung
(74) *Attorney, Agent, or Firm*—Lisa K. Jorgenson; E. Russell Tarleton; Seed IP Law Group PLLC (57) ABSTRACT

A current sense amplifier, in particular for low voltage applications, of the type incorporated in a memory electronic device and including a differential amplifier having inputs respectively associated with a matrix circuit leg, connected to a cell to be sensed, and a reference circuit leg, connected a reference cell. At least the matrix circuit leg has a first MOS transistor to which an inverter is connected in a cascode configuration and a first input of the differential amplifier corresponding to the matrix circuit leg is coupled to a conduction terminal of the first MOS transistor and to the bitline of the memory matrix by a second MOS transistor.

23 Claims, 6 Drawing Sheets

CURRENT SENSE AMPLIFIER FOR LOW VOLTAGE APPLICATIONS WITH DIRECT SENSING ON THE BITLINE OF A MEMORY MATRIX

BACKGROUND OF THE INVENTION

1. Field of the Invention

The present invention relates to a current sense amplifier for low voltage applications with direct sensing on the bitline of a memory matrix and, more in particular, to an amplifier of the above type and incorporated into a memory electronic device.

2. Description of the Related Art

As it is well known in this specific technical field, the conventional architecture of a sense amplifier is critical for power supply references lower than 1.8V.

Figure 1:
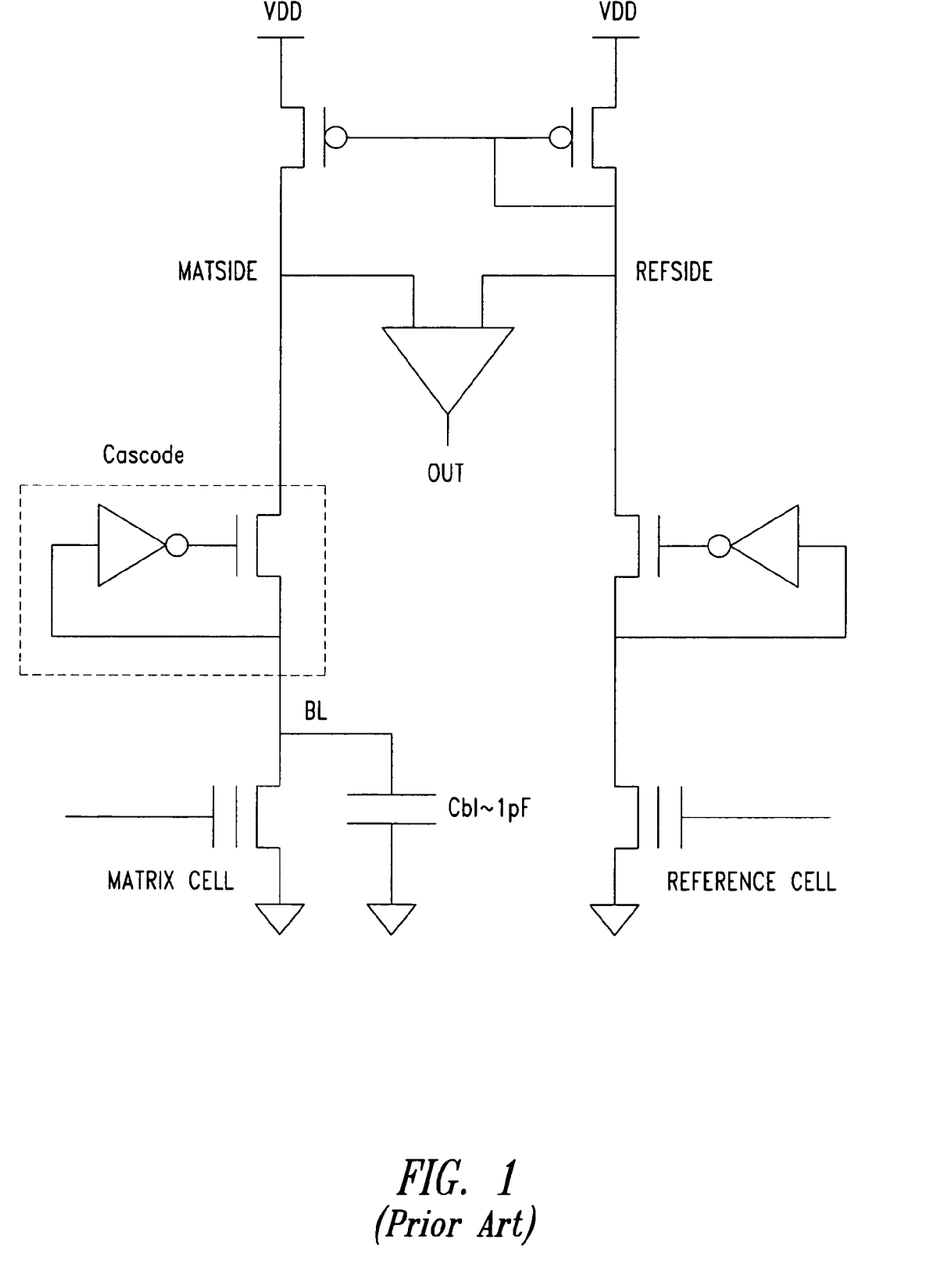
FIG. 1 shows a schematic view of a sense amplifier realized according to the prior art.

In the herewith attached FIG. 1, the structure of a sense amplifier of the known type is schematically shown, for example as described by G. Campardo, M. Dallabora, D. Novosel: "L'amplificatore di lettura nei dispositivi di memoria EPROM", Alta Frequenza, July-August 1988, which comprises a differential amplifier having inputs associated with respective MATSIDE and REFSIDE legs connected to a cell of the memory matrix and to a reference cell.

It is to be noted that, in the sense amplifier operation, the voltage requested to bias the drain terminal of the matrix cell to be sensed, also indicated with node BL of FIG. 1, does not scale down significantly when the power supply reference scales down.

During the sensing step, the biasing voltage values of the bitline vary between 0.6V and 0.9V. This reduces the dynamics of the MATSIDE node to a voltage between the bitline voltage, which has little variability with the technology evolution, and the supply voltage Vdd, which is likely to decrease in the near future.

A possible solution to this problem is described in the European patent application published under no. 1 426 965, inventors F. De Santis and M. Pasotti, entitled: "Folded Sensing Low Voltage Application."

Although advantageous under several aspects, this approach, however, exhibits some disadvantages. For example the sense amplifier described in the above patent application uses a fed back operational amplifier and a PMOS transistor to bias the bitline while sensing.

However this solution is less efficient than the traditional cascode of FIG. 1 since it penalizes the access time.

Moreover, the sensing circuitry is forced to work under the bitline biasing voltage.

Other alternative solutions provide the use of boosted voltages in the sensing circuitry, raising further problems of noise immunity while sensing, besides requiring additional circuit portions with charge pump.

The technical problem is that of maintaining a quick access time during the sensing step and thus overcoming the limits of the prior circuits.

BRIEF SUMMARY OF THE INVENTION

The invention proposes to face the problem of sensing non volatile memories of the EEPROM flash type with a NOR structure having one bit per cell, a single supply lower or equal to 1.8V, the improvement of the access time being the main objective.

The solution of this problem is fundamental, for example, for embedded flash memories, realised by using multi-purpose manufacturing processes using lower and lower power supply references (for example CMOSM8$\geq$1.8V, CMOSM9$\geq$1.2V, CMOSM10$\geq$1V), ensuring, for the circuit portions in fast logic (micro, dsp, peripheral), full compatibility with the corresponding HCMOS8-9-10 processes as regards performances and density.

The solution idea underlying the disclosed embodiments of the present invention is that of providing a method of current sensing, i.e., a comparison between the current crossing the memory cell in the sensing step and the current crossing the reference cell, such method being able to operate independently from the supply voltage value.

In accordance with one embodiment of the invention, a current sense amplifier for low voltage applications with direct sensing on the bitline of a memory matrix is provided. The memory matrix includes a matrix of memory cells organised into cell rows, or word lines, and cell columns, or bitlines, and associated with corresponding sensing, programming and erasing circuits of the memory cells content, and the amplifier includes a differential amplifier having inputs respectively associated with a matrix circuit leg, connected to a cell to be sensed, and a reference circuit leg, connected to a reference cell.

In accordance with another embodiment of the invention, a current sense amplifier for low voltage applications of the type incorporated in a memory electronic device having a matrix of memory cells organized into cell rows, or word lines, and cell columns, or bitlines, and associated with corresponding sensing, programming, and erasing circuits of the cells' content is provided. The amplifier includes a differential amplifier having inputs associated with a matrix circuit leg connected to a cell to be sensed, and a reference circuit leg connected to a reference cell, and at least the matrix circuit leg comprises a first MOS transistor to which an inverter is connected in a cascode configuration and in that a first input node of the differential amplifier corresponding to the matrix circuit leg is coupled to a conduction terminal of the first MOS transistor and to the bitline of the memory matrix by means of a second MOS transistor.

In accordance with another embodiment of the invention, a circuit is provided that includes a matrix leg having a bitline coupled to a matrix cell to be sensed, the matrix leg comprising a first transistor having a first terminal coupled to a voltage source, a second terminal coupled to the bitline, and a control terminal coupled to the second terminal via an inverter, a reference leg having a conduction line coupled to a reference cell, the reference leg comprising a second transistor having a first terminal coupled to the voltage source, a second terminal coupled to the conduction line, and a control terminal coupled to the conduction line via an inverter, and a differential amplifier having first and second inputs and an output constituting an output of the circuit, the first input coupled to the bitline via a third transistor having a first terminal coupled to the first input of the differential amplifier, a second terminal coupled to a body terminal of the first transistor, and a control terminal coupled to the second terminal of the first transistor, and the second terminal of the differential amplifier coupled to the conduction line via a fourth transistor having a first terminal coupled to the second input of the differential amplifier, a second terminal coupled to a body terminal of the second transistor, and a control terminal coupled to the second terminal of the second transistor.

In accordance with another aspect of the foregoing embodiment, the circuit further includes a fifth transistor having a first terminal coupled to a ground reference, a second terminal coupled to the first terminal of the third transistor, and a control terminal, and a sixth transistor having a first terminal coupled to the ground reference, a second terminal coupled to the first terminal of the fourth transistor, and a control terminal coupled to the control terminal of the fifth transistor and to the second terminal of the sixth transistor.

In accordance with another aspect of the foregoing embodiment, body terminals of the third and fourth transistors are coupled to either body terminals of the first and second transistors or to the voltage source.

In accordance with another embodiment of the invention, a circuit is provided that includes a matrix leg having a bitline coupled to a matrix cell to be sensed, the matrix leg comprising a first transistor having a first terminal coupled to a voltage source, a second terminal coupled to the bitline, and a control terminal coupled to the second terminal via an inverter, a reference leg having a conduction line coupled to a reference cell, the reference leg comprising a second transistor having a first terminal coupled to the voltage source, a second terminal coupled to the conduction line, and a control terminal coupled to the conduction line via an inverter, an equalization leg comprising a first equalization transistor and a second equalization transistor series coupled between the voltage source and a ground reference, and a differential amplifier having first and second inputs and an output constituting an output of the circuit, the first input coupled to the bitline via a third transistor having a first terminal coupled to the first input of the differential amplifier, a second terminal coupled to a body terminal of the first transistor, and a control terminal coupled to the second terminal of the first transistor, and the second terminal of the differential amplifier coupled to a node formed by the series connection of the first equalization transistor and the second equalization transistor, the second equalization transistor having a control terminal coupled to a second terminal of a fourth transistor having a first terminal coupled to a body terminal of the second transistor and a control terminal coupled to the conduction line, and the control terminal of the first equalization transistor coupled to the first input of the differential amplifier, and the second equalization transistor has a conduction terminal coupled to the ground reference.

In accordance with another aspect of the foregoing embodiment, the circuit includes a fifth transistor having a first terminal coupled to a ground reference, a second terminal coupled to the first terminal of the third transistor, and a control terminal, and a sixth transistor having a first terminal coupled to the ground reference, a second terminal coupled to the first terminal of the fourth transistor, and a control terminal coupled to the control terminal of the fifth transistor and to the second terminal of the sixth transistor.

BRIEF DESCRIPTION OF THE SEVERAL VIEWS OF THE INVENTION

The characteristics and advantages of the amplifier according to the invention will be apparent from the following description of an embodiment thereof given by way of indicative and non limiting example with reference to the annexed drawings.

DETAILED DESCRIPTION OF THE INVENTION

Figure 2:
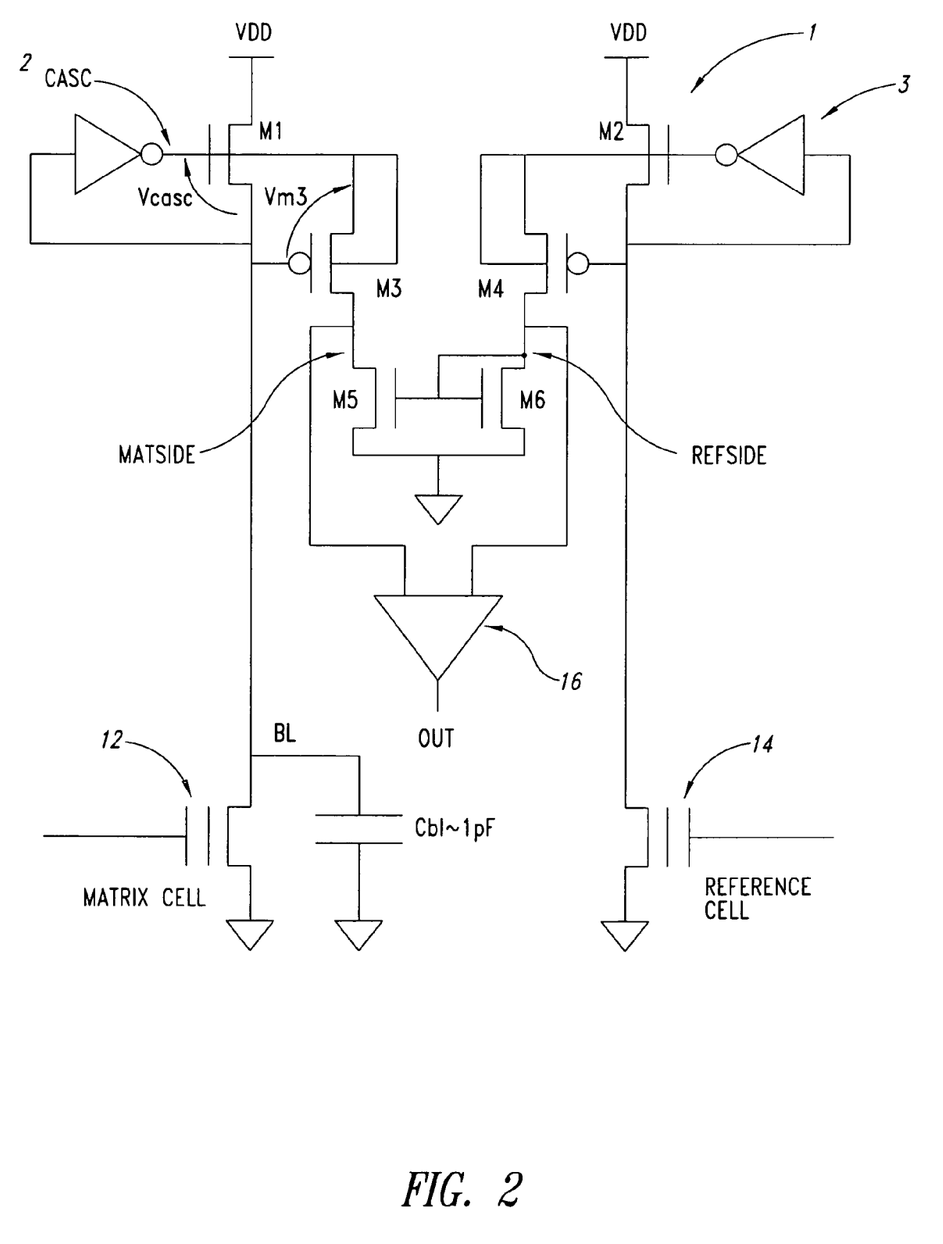
FIG. 2 shows a schematic view of a sense amplifier realized according to the present invention.

With reference to the figures, and in particular to FIG. 2, globally and schematically shown therein is a current sense amplifier 1 realized according to the present invention for low voltage applications with sensing directed onto the bitline of a memory matrix.

The sense amplifier 1 includes a differential architecture with a matrix leg and a reference leg that are respectively connected to a memory cell to be sensed, i.e., a matrix cell 12 whose informational content is to be sensed, and to a reference cell 14.

The matrix and reference legs are respectively coupled to corresponding inputs of a differential amplifier 16 connected to an output terminal OUT.

The matrix leg is inserted between a first supply voltage reference, indicated with Vdd, and the bitline BL of the matrix of memory cells. Such leg comprises a first MOS transistor indicated with M1, to which an inverter 2 is connected in a cascode configuration.

Similarly, the reference leg is inserted between the supply Vdd and the reference cell and it comprises a MOS transistor, indicated with M2, to which an inverter 3 is connected in a cascode configuration.

The transistor M1 is preferably of the NMOS type and it is connected to a transistor M3 of the PMOS type in diode configuration. More in particular, the source terminal of the transistor M1 is connected to the body of the transistor M3, while the body of the transistor M1 is connected to ground GND by means of a conduction terminal of the transistor M3.

The transistor M3 is part of a complementary pair that includes a transistor M5, also of the NMOS type, inserted in series between the transistor M3 and a second supply voltage reference, for example a signal ground GND.

Also the transistor M2 is preferably of the MOS type, and it is connected to a transistor M4 of the PMOS type in diode configuration.

The transistor M4 is part of a second complementary pair that comprises also a transistor M6, of the NMOS type, inserted in series between the transistor M4 and the ground reference GND.

The transistors M5 and M6 have their control terminals connected to each other and to the interconnection node REFSIDE between the transistors M4 and M6, which makes the transistor M6 diode-configured.

The node REFSIDE is connected to an input of the output differential amplifier 16 while the interconnection node MATSIDE between the transistors M3 and M5 is connected to the other input of the same output operation amplifier 16.

The architecture of the sense amplifier 1 enables biasing of the bitline by means of a traditional cascode circuit that includes the transistor M1 and the inverter 2, thus ensuring an efficient pre-charging of the bitline. Moreover, voltage boosters are not used.

The current of the matrix cell, under steady conditions, is equal to the current flowing in the transistor M1, and it is determined by the following relation:

$$Vcasc = Vtn + Voverdrive$$

and with $$Vm3 = Vcasc$$

The transistor M3 can thus be sized so that, under steady conditions, it conducts a current being equal or proportional to the current of the matrix cell.

Similarly, in the reference leg, the current of the reference cell, or a current proportional thereto, will be mirrored to the transistor M5.

It is important to highlight that the transistors M1 and M3 are not a current mirror and it is not fundamental that they conduct the same current.

The matching needs of the sense amplifier 1 do not exist that much between the transistors M1 and M3, but do exist between the transistors of the matrix side M1, M3 and M5 and the corresponding transistors M2, M4 and M6 of the reference side.

In substance, the sense amplifier 1 is effectively a differential architecture where, under steady conditions, the current difference between the reference and the matrix legs matters. For a correct operation of the circuit it is necessary to ensure that when the transistor M1 conducts, the transistor M3 also conducts.

In a CMOS process where the thresholds of the NMOS and PMOS transistors are almost identical, the body effect helps to satisfy this constraint. In fact this effect is strong on the transistor M1 and weak on the transistor M3, having connected to ground the body of M1, and to its source the one of M3.

In order for the above constraint to be met, having the body effect on the transistors M3 and M4 can be not indispensable; in such case, the bulk of M3 and M4 could be connected to the supply voltage Vdd.

The architecture 1 according to the invention exhibits the following advantages:

it preserves the cascode portion (M1, inverter 2) for biasing the bitline, ensuring a fast pre-charge of the bitline;

the presence of the complementary pair M3, M5 does not alter the cascode correct operation, in fact the current crossing such leg during the pre-charging step is in any case limited by the reference current mirrored to the transistor M5; and under steady condition the current in the pair M3 and M5 has an order of magnitude similar to that of the cell (between 10 and 20 microA), and it can be supplied without problems by the inverter 2 of the cascode portion.

It is important to note that, especially in the first transient step for the bitline pre-charge, the current for charging the bitline capacity is large, and if this were replicated in the transistor M3 the speed of the cascode circuit portion would be jeopardized. The replicated current is, however, limited by the presence of the transistor M5.

As in some architectures of the known type, the cascode portion also has the function of decoupling the node BL, which is very capacitive, from the node MATSIDE, which has little capacitance. This allows the node MATSIDE to move quickly, ensuring a fast sensing step.

The node MATSIDE thus preserves good dynamics and can quickly move between the ground GND voltage and the gate voltage of the transistor M1, which for VDD<1.8V is near the power supply.

The voltage-to-current conversion mechanism of the present invention exploits both the gate terminal of the cascode supplying the transistor M3 and the bitline connected to the gate terminal of the transistor M3.

This voltage-to-current conversion mechanism will not be described hereafter in detail since it is similar to what is described by E. Seevinck et al. in the article: "Current mode techniques for high speed VLSI circuits with application to current sense amplifier for CMOS SRAM's", IEEE JOURNAL OF SOLID STATE CIRCUITS, VOL. 26, NO. 4, APRILE 1991, herewith incorporated by reference.

The fact that the bitline BL is biased with the same value in the case of a virgin cell and of a programmed cell is thus not remarkable.

In fact, due to this "direct sensing" of the bitline voltage, it is possible to adjust the resistivity of the transistor M1 to ensure a sufficient overdrive voltage, which is obtained both with the enhancement of the voltage applied to the gate terminal of the transistor M1, and with the decrease, in the case of an erased cell, of the biasing voltage applied to the bitline.

All the available signal, i.e., the voltage difference between the gate terminal of the transistor M1 and its source terminal, corresponding to the bitline, is measured by this sense, ensuring high precision.

Figure 3:
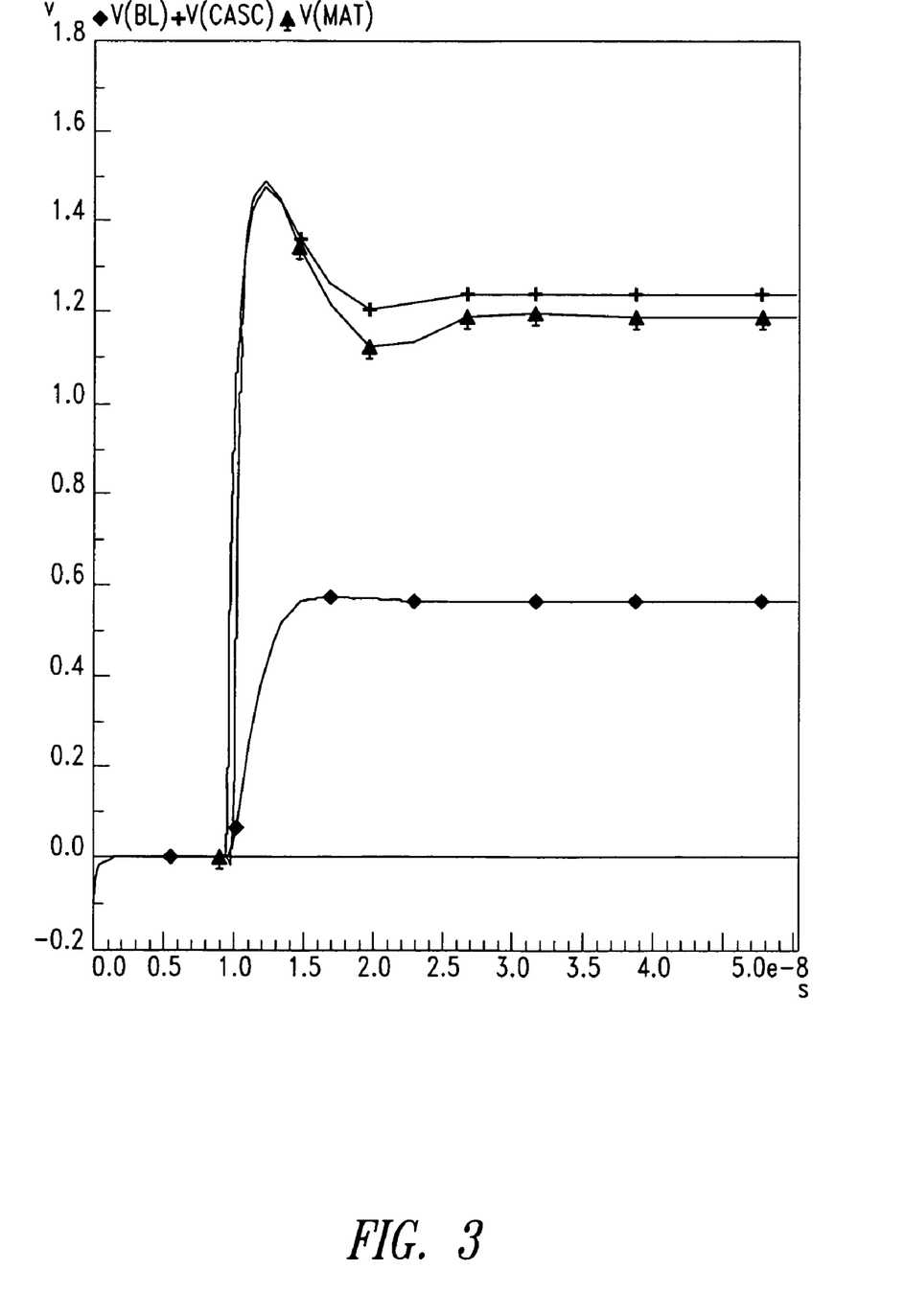
FIG. 3 shows a simulation diagram of the pattern, as a function of the time (s), of the voltage values (V) at some nodes of the sense amplifier of FIG. 2 in an erased cell condition.
Figure 4:
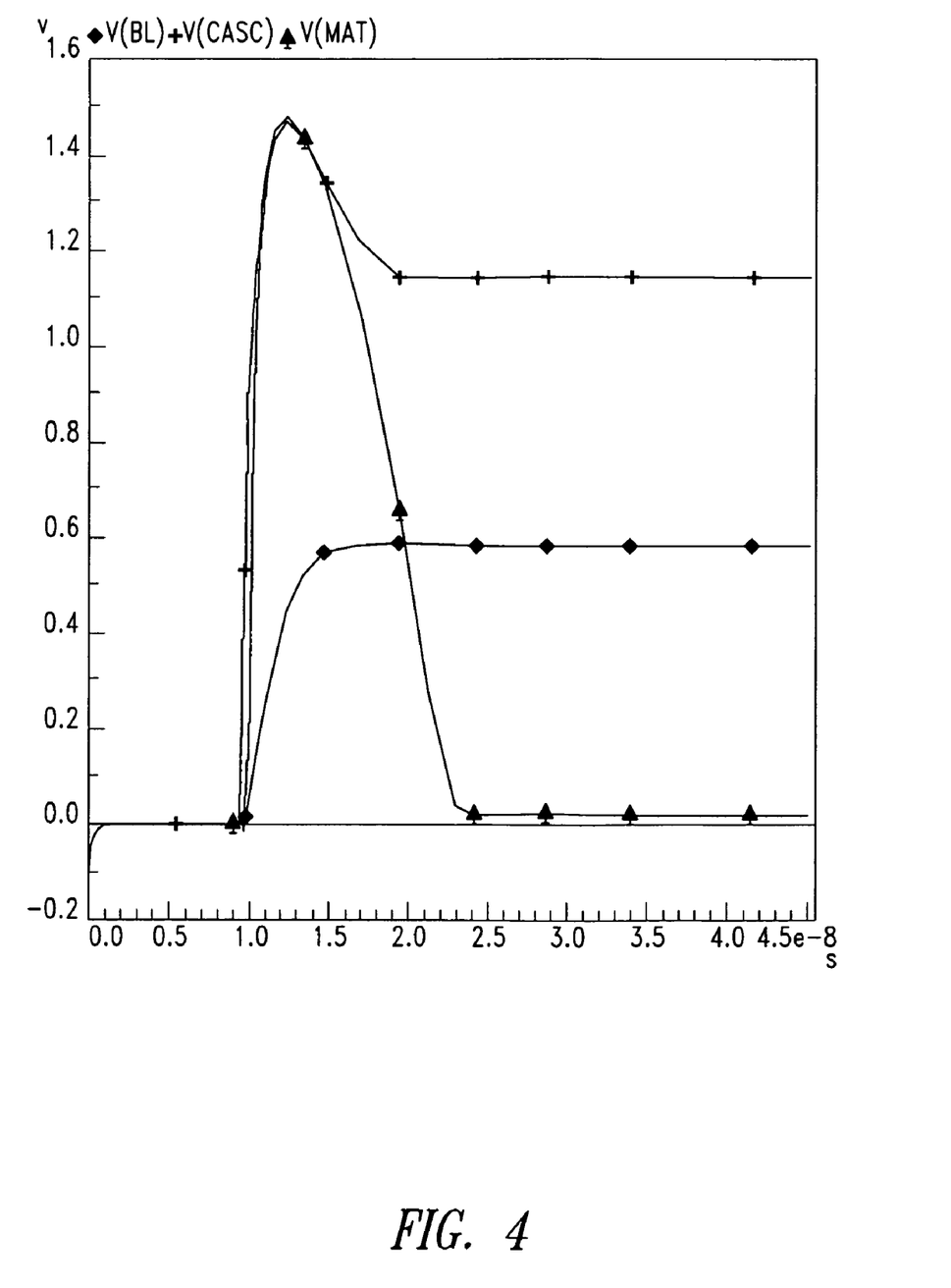
FIG. 4 shows a simulation diagram of the pattern, as a function of the time (s), of the voltage values (V) at some nodes of the sense amplifier of FIG. 2 in a programmed cell condition.

FIGS. 3 and 4 respectively show, in the form of a voltage-time diagram, the results of simulations reporting the patterns of the voltage values in time at three nodes: bitline BL, cascode CASC and MATSIDE.

FIG. 3 shows the results of sensing of an erased cell that conducts a current of 14 microA; while FIG. 4 reports the results in the case of sensing of a programmed cell. In both cases they are cells obtained with a process CMOSM8 and subjected to a supply of 1.5V.

The circuit of the invention thus provides a sense amplifier able to operate with supply voltages of about 1.2V and 1V, preserving competitive access times, even lower than 20 ns in the case of embedded flash memories wherein the output datum is brought onto an inner bus and not onto the pads of the device.

The sense amplifier of the present invention is suitable to be employed in a "latch" structure parallel to that of the conventional latch senses.

A technical expert of this field will be enabled to bring variations and changes to the sense amplifier according to the invention all within the scope of protection of the invention.

For example, through a suitable sizing of the transistor M3, it is also possible to amplify the starting current signal: i.e., it is possible to see to it that:

$$Im3 = n*Icell.$$

Figure 6:
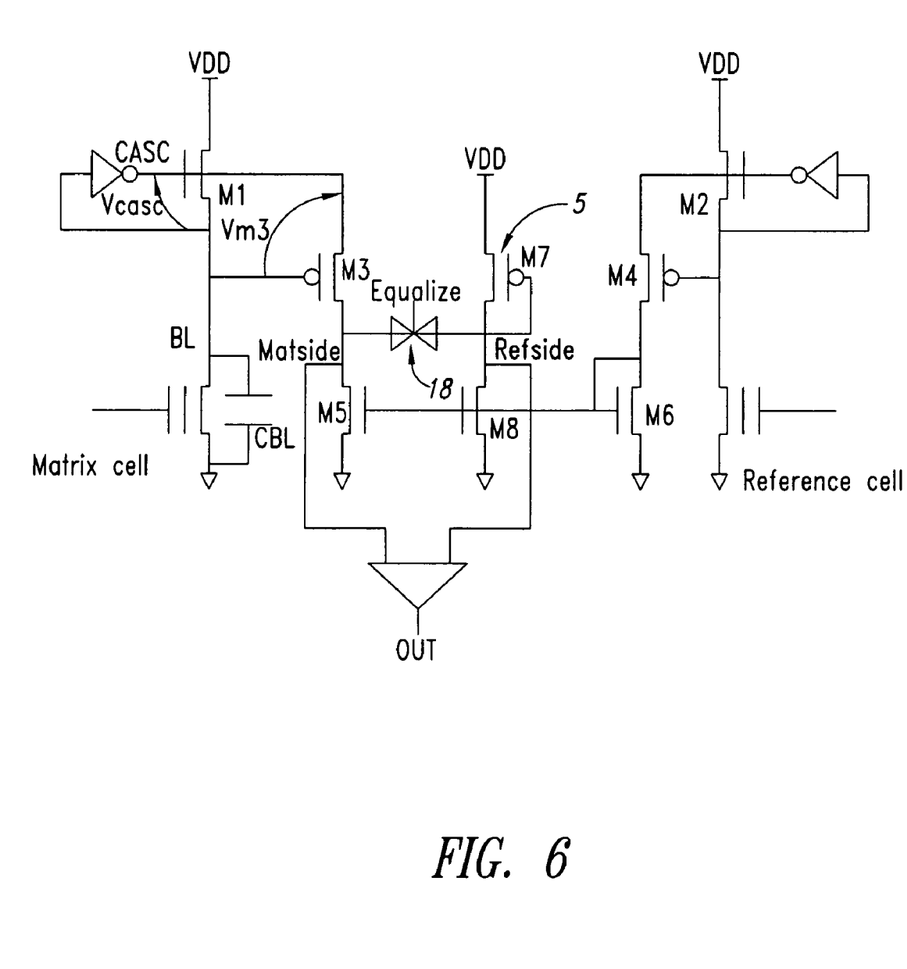
FIG. 6 shows a schematic view of the sense amplifier of FIG. 2 provided with an equalization circuit portion.

It is also possible to provide an equalization between the nodes MATSIDE and REFSIDE, for example as shown in the scheme of FIG. 6, which requires an additional leg 5 for realizing the equalization.

In the solution of FIG. 2 the diode-connected transistor M6 would not ensure a sufficient current limitation during the pre-charge step in case of equalization.

In the example of FIG. 6, instead, the node REFSIDE should have a constant potential value approximately equal to half of the dynamics of the node MATSIDE, i.e., equal to Vcasc/2. In the circuit of FIG. 6, a conduction terminal of the transistor M6 is connected to ground, and the input terminal of the differential amplifier 16 is coupled to the leg 5. The optional leg 5 includes series-coupled transistors M7 and M8 forming a node that is coupled to the differential amplifier 16. The control terminal of M7 is coupled to the node formed by series-coupled transistors M3 and M5 via an equalization element 18. A control terminal of M8 is coupled to the control terminals of M5 and M6.

It is to be noted that Im3 is not, in general, equal to Icell, and this increases the importance of a reference current generated in the same way, which ensures an ideal matching for example when the temperature or the power supply vary.

Figure 5:
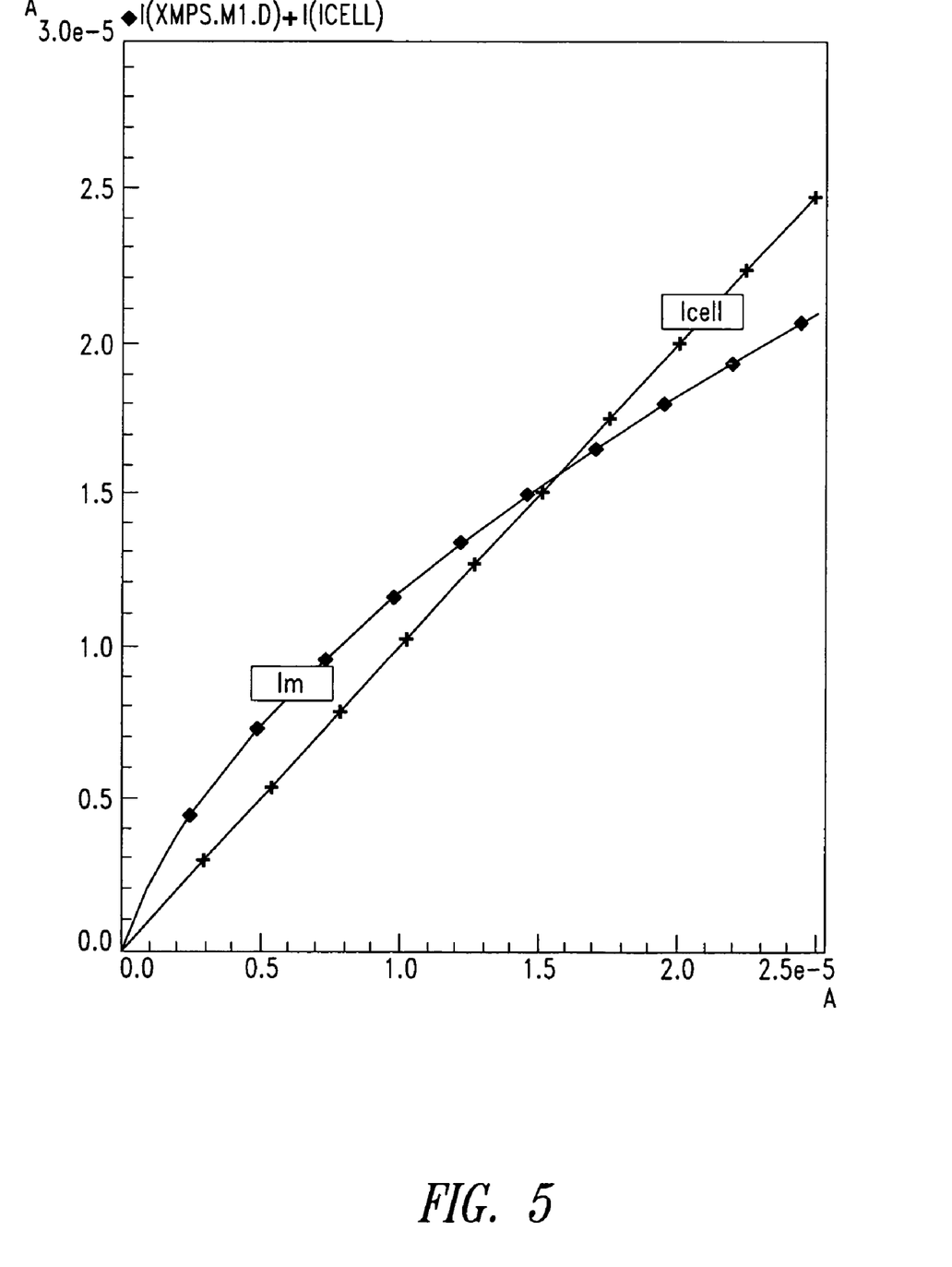
FIG. 5 shows, in a simulation diagram, the pattern of curves current-current showing a relation between the current of the memory cell and a current crossing a transistor M3 in the sense amplifier of FIG. 2.

The relation between the current flowing in the transistor M3 and the one flowing in the cell is shown in the diagram of FIG. 5 where one can appreciate that Icell-Im3 is an increasing monotonic curve.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A current sense amplifier, in particular for low voltage applications, of the type incorporated in a memory electronic device having a matrix of memory cells organized into cell rows, or word lines, and cell columns, or bitlines, and associated with corresponding sensing, programming, and erasing circuits of the cells content, the amplifier comprising a differential amplifier having inputs associated with a matrix circuit leg connected to a cell to be sensed, and a reference circuit leg connected to a reference cell, and at least the matrix circuit leg comprises a first MOS transistor to which an inverter is connected in a cascode configuration and in that a first input node of the differential amplifier corresponding to the matrix circuit leg is coupled to a conduction terminal of the first MOS transistor and to the bitline of the memory matrix by means of a second MOS transistor.

2. The sense amplifier of claim 1 wherein the second MOS transistor has a gate terminal connected to said conduction terminal of the first MOS transistor and its conduction terminal connected to the first input node of said differential amplifier.

3. The sense amplifier of claim 1 wherein the first MOS transistor is of the NMOS type and the second MOS transistor is of the PMOS type.

4. The sense amplifier of claim 2 wherein a source terminal of the first MOS transistor is connected to a body terminal of the second MOS transistor, while a body terminal of the first MOS transistor is connected to ground by means of a conduction terminal of the second MOS transistor.

5. The sense amplifier of claim 3 wherein the second MOS transistor is part of a complementary pair that comprises also a third MOS transistor inserted in series between the second MOS transistor and a first voltage reference.

6. The sense amplifier of claim 5 wherein the reference leg is inserted between a second voltage reference and the reference cell and it comprises a fourth MOS transistor to which an inverter is connected in a cascode configuration.

7. The sense amplifier of claim 6 wherein a second input node of the differential amplifier corresponding to the reference circuit leg is coupled to a conduction terminal of the fourth MOS transistor by means of a fifth MOS transistor inserted in a complementary pair that comprises a sixth MOS transistor inserted in series between the fifth MOS transistor and the first voltage reference.

8. The sense amplifier of claim 7 wherein the third and sixth transistors of the complementary pairs have the control terminals connected to each other and to the second input node of the differential amplifier.

9. The sense amplifier of claim 1 wherein under steady conditions, the current in the first complementary pair of transistors has an order of magnitude equal to that of the memory cell to be sensed.

10. The sense amplifier of claim 5 wherein the third MOS transistor is of the NMOS type.

11. The sense amplifier of claim 7 wherein the fourth and sixth MOS transistors are of the NMOS type and the fifth MOS transistor is of the PMOS type.

12. The sense amplifier of claim 1, comprising an additional equalization leg.

13. A circuit, comprising:
a matrix leg having a bitline coupled to a matrix cell to be sensed, the matrix leg comprising a first transistor having a first terminal coupled to a voltage source, a second terminal coupled to the bitline, and a control terminal coupled to the second terminal via an inverter;
a reference leg having a conduction line coupled to a reference cell, the reference leg comprising a second transistor having a first terminal coupled to the voltage source, a second terminal coupled to the conduction line, and a control terminal coupled to the conduction line via an inverter; and
a differential amplifier having first and second inputs and an output constituting an output of the circuit, the first input coupled to the bitline via a third transistor having a first terminal coupled to the first input of the differential amplifier, a second terminal coupled to a body terminal of the first transistor, and a control terminal coupled to the second terminal of the first transistor, and the second terminal of the differential amplifier coupled to the conduction line via a fourth transistor having a first terminal coupled to the second input of the differential amplifier, a second terminal coupled to a body terminal of the second transistor, and a control terminal coupled to the second terminal of the second transistor.

14. The circuit of claim 13, further comprising:
a fifth transistor having a first terminal coupled to a ground reference, a second terminal coupled to the first terminal of the third transistor, and a control terminal, and a sixth transistor having a first terminal coupled to the ground reference, a second terminal coupled to the first terminal of the fourth transistor, and a control terminal coupled to the control terminal of the fifth transistor and to the second terminal of the sixth transistor.

15. The circuit of claim 14, further comprising a capacitance coupled between the bitline and the ground reference.

16. The circuit of claim 14 wherein body terminals of the third transistor and of the fourth transistor are each coupled to the body terminals of the first and second transistors.

17. The circuit of claim 14 wherein body terminals of the third transistor and of the fourth transistor are each coupled to the voltage source.

18. The circuit of claim 14 wherein the first transistor is sized to conduct a current equal to a current conducted by the matrix cell.

19. The circuit of claim 14 wherein the fifth transistor is sized to mirror current conducted by the reference cell.

20. A circuit, comprising:
- a matrix leg having a bitline coupled to a matrix cell to be sensed, the matrix leg comprising a first transistor having a first terminal coupled to a voltage source, a second terminal coupled to the bitline, and a control terminal coupled to the second terminal via an inverter;
- a reference leg having a conduction line coupled to a reference cell, the reference leg comprising a second transistor having a first terminal coupled to the voltage source, a second terminal coupled to the conduction line, and a control terminal coupled to the conduction line via an inverter;
- an equalization leg comprising a first equalization transistor and a second equalization transistor series coupled between the voltage source and a ground reference; and
- a differential amplifier having first and second inputs and an output constituting an output of the circuit, the first input coupled to the bitline via a third transistor having a first terminal coupled to the first input of the differential amplifier, a second terminal coupled to a body terminal of the first transistor, and a control terminal coupled to the second terminal of the first transistor, and the second terminal of the differential amplifier coupled to a node formed by the series connection of the first equalization transistor and the second equalization transistor, the second equalization transistor having a control terminal coupled to a second terminal of a fourth transistor having a first terminal coupled to a body terminal of the second transistor and a control terminal coupled to the conduction line, and the control terminal of the first equalization transistor coupled to the first input of the differential amplifier, and the second equalization transistor has a conduction terminal coupled to the ground reference.

21. The circuit of claim 20, further comprising a fifth transistor having a first terminal coupled to a ground reference, a second terminal coupled to the first terminal of the third transistor, and a control terminal, and a sixth transistor having a first terminal coupled to the ground reference, a second terminal coupled to the first terminal of the fourth transistor, and a control terminal coupled to the control terminal of the fifth transistor and to the second terminal of the sixth transistor.

22. The circuit of claim 21 wherein body terminals of the third and fourth transistors are each coupled to the body terminals of the first and second transistors.

23. The circuit of claim 21 wherein body terminals of the third and fourth transistors are each coupled to the voltage source.

* * * * *